(12) United States Patent
Hanzlik (10) Patent No.: US 7,038,534 B2
(45) Date of Patent: May 2, 2006

(54) CLASS D AUDIO AMPLIFIER AND METHOD FOR COMPENSATION OF POWER SUPPLY VOLTAGE INFLUENCE ON OUTPUT AUDIO SIGNAL IN CLASS D AUDIO AMPLIFIER

(75) Inventor: Tomasz Hanzlik, Wroclaw (PL)

(73) Assignees: Advanced Digital Broadcast Polska Sp. z o.o., Zielona Gora (PL); Advanced Digital Broadcast Ltd., Taipei (TW)

( * ) Notice: Subject to any disclaimer, the term of this patent is extended or adjusted under 35 U.S.C. 154(b) by 49 days.

(21) Appl. No.: 10/502,026

(22) PCT Filed: Jan. 18, 2003

(86) PCT No.: PCT/PL03/00006

§ 371 (c)(1),
(2), (4) Date: Jul. 20, 2004

(87) PCT Pub. No.: WO03/061117

PCT Pub. Date: Jul. 24, 2003

(65) Prior Publication Data

US 2005/0083113 A1    Apr. 21, 2005

(30) Foreign Application Priority Data

Jan. 21, 2002    (PL) .................................... 351783

(51) Int. Cl.
*H03F 3/38* (2006.01)
*H03F 3/217* (2006.01)
(52) U.S. Cl. ................. 330/10; 330/251; 330/207 A
(58) Field of Classification Search ................ 330/10, 330/251, 207 A
See application file for complete search history.

(56) References Cited

U.S. PATENT DOCUMENTS 4,178,556 A    12/1979    Attwood (Continued)

FOREIGN PATENT DOCUMENTS

PL    P-325207    9/1999

OTHER PUBLICATIONS

Hancock J.: A Class D Amplifier Using MOSFETs with Reduced Minority Carrier Lifetime, Journal of the Audio Engineering Society, Sep. 1, 1991, USA.

*Primary Examiner*—Patricia Nguyen
(74) *Attorney, Agent, or Firm*—Matthias Scholl (57) ABSTRACT

In a class D electroacoustic amplifier (1) without feedback loop containing a supply voltage source (8), an amplifier low-pass filter (14), a power stage (2) controlled by a pulse width modulated signal, a saw-shaped voltage generator (4) and a comparator (3), to one of which inputs an audio signal is sent, while its second input is connected to the adder (6) of the compensation circuit of supply voltage influence on the output audio signal, to which a voltage from a reference voltage source is sent, a low-pass filter (9) and a high-pass filter (10) are connected to the supply voltage source (8), and the reference voltage source (12) is connected to an inverting circuit (11), whose input is connected to the low-pass filter (9) output, while the high-pass filter (10) output and the output of the inverting circuit (11) are connected to a multiplier (7), whose output is connected to the input of another multiplier (5), whose second input is connected to the saw-shaped voltage generator (4), and the multiplier (5) output is connected to one input of the adder (6) whose second input is connected to the saw-shaped voltage generator (4).

10 Claims, 5 Drawing Sheets

U.S. PATENT DOCUMENTS

| | | |
|---|---|---|
| 4,182,992 A | 1/1980 | Attwood |
| 5,160,896 A | 11/1992 | McCorkle |
| 5,262,733 A | 11/1993 | Nakajima |
| 5,559,467 A | 9/1996 | Smedley |
| 5,982,231 A * | 11/1999 | Nalbant ................. 330/10 |
| 6,016,075 A * | 1/2000 | Hamo ................. 330/10 |
| 6,166,596 A * | 12/2000 | Higashiyama et al. ........ 330/10 |
| 6,300,825 B1 | 10/2001 | Dijkmans et al. |
| 6,628,221 B1 * | 9/2003 | Jin ................. 341/152 |
| 6,809,586 B1 * | 10/2004 | Hobboosh et al. ............ 330/10 |

\* cited by examiner

Fig. 9 ic amplifier, i.e. a class D audio amplifier, and a method for compensation of power supply voltage influence on an output audio signal in the class D audio amplifier.

CLASS D AUDIO AMPLIFIER AND METHOD FOR COMPENSATION OF POWER SUPPLY VOLTAGE INFLUENCE ON OUTPUT AUDIO SIGNAL IN CLASS D AUDIO AMPLIFIER

CROSS-REFERENCE TO RELATED APPLICATIONS

This is a National Stage Application of International Patent Application No. PCT/PL 03/00006, with an international filing date of Jan. 18, 2003, which is based on Polish Patent Application No. P-351783, filed Jan. 21, 2002.

BACKGROUND OF THE INVENTION

1. Field of the Invention

The present invention relates to a class D electroacoustic amplifier, i.e. a class D audio amplifier, and a method for compensation of power supply voltage influence on an output audio signal in the class D audio amplifier.

2. Brief Description of the Background of the Invention Including Prior Art

One of the features of class D electroacoustic amplifiers is making use of a carrier signal apart from the audio signal. One of these amplifiers is the one known from the U.S. Pat. No. 4,182,992, which consists of, among others, two transistors and a diode.

In turn, from the U.S. Pat. No. 4,178,556 there is known a class D amplifying circuit that contains a modulating circuit to modulate an audio signal and a carrier signal.

There is also known, from the U.S. Pat. No. 6,300,825 an amplifier that makes use of pulse width modulation of a signal, containing a comparator and an integrating circuit, which in order to increase the coefficient of rejection of supply voltage fluctuations, was supplemented with another integrating circuit.

From the Polish patent description P-325207 there is known a circuit for compensation of the constant component of the output voltage, powered by a stabilised voltage that generates a voltage compensation signal. This signal is added in an adder to a voltage signal of a triangular wave generator and in this way it changes the constant component of the output signal of the generator. The changed constant component influences the value of the duty cycle coefficient of the rectangular impulses generated at the output of the comparator, compensating to a degree the supply voltage fluctuations.

SUMMARY OF THE INVENTION

1. Purposes of the invention

It is an object of this invention to provide a device and a method for increasing quality of audio signals at the output of audio amplifiers.

This and other objects and advantages of the present invention will become evident from the description which follows.

2. Brief Description of the Invention

According to the present invention, in a class D electroacoustic amplifier, i.e. a class D audio amplifier, without feedback loop that contains a supply voltage source, an amplifier low-pass filter, a power stage controlled by a pulse width modulated signal, a saw-shaped voltage generator and a comparator, to one of which inputs an audio signal is sent, while its second input is connected to the adder of the compensation circuit of supply voltage influence on the output audio signal, to which a voltage from a reference voltage source is sent, a low-pass filter and a high-pass filter are connected to the supply voltage source, and the reference voltage source is connected to an inverting circuit, whose input is connected to the low-pass filter output, while the high-pass filter output and the output of the inverting circuit are connected to a multiplier, whose output is connected to the input of another multiplier, whose second input is connected to the saw-shaped voltage generator, and the multiplier output is connected to one input of the adder, whose second input is connected to the saw-shaped voltage generator.

Preferably, the output signal $v_0(t)$ of the inverting circuit sent to the multiplier input, which is a modified constant of the supply voltage, is expressed by a formula $v_0(t)=k_1 \times V_{DCref}/[k_2 \times v_i(t)]$, where $V_{DCref}$ is the voltage of the reference source, $v_i(t)$ is a slow-changing signal on the low-pass filter output, and the coefficient $k_1 \epsilon <0.5; 2.0>$ and the coefficient $k_2 \epsilon <0.2; 1.5>$.

Preferably, the output signal of the multiplier, which is the error signal $e(t)$, sent to the multiplier, is expressed by the formula $e(t)=k_3 \times v_0(t) \times v_{ii}(t)$, where $v_0(t)$ is a modified supply voltage constant, $v_{ii}(t)$ is a fast-hanging signal on the high-pass filter output, and the coefficient $k_3 \epsilon <0.8; 10.0>$.

Preferably, the output signal $V_{CM}(t)$ of the adder, which is the corrected carrier wave signal, sent to one input of the comparator, is expressed by the formula $V_{CM}(t)=k_4 \times V_C(t) \times [1/k_5+e(t)]$, where $V_C(t)$ is a high frequency carrier wave generated by the generator, $e(t)$ is the error signal, and the coefficient $k_4 \epsilon <0.2; 1.5>$ and the coefficient $k_5 \epsilon <0.2; 3.0>$.

The object of the invention is also a method of compensation of supply voltage influence on the output audio signal in an electroacoustic amplifier, which contains a saw-shaped signal generator and a comparator making use of pulse width modulation, and which is powered from a power supply, and to whose input an audio signal is sent, and whose second input is connected to an adder of a compensation circuit of supply voltage influence on the output audio signal, to which a voltage from a reference voltage source is sent, from the power supply source a fast-changing signal $v_{ii}(t)$ is extracted and a slow-changing signal $v_i(t)$, which is inverted and multiplied by the a value of a reference supply voltage $V_{Dcref}$, which results in an output signal $v_0(t)$, which then is multiplied by a fast-changing signal $v_{ii}(t)$, which results in an error signal $e(t)$, which then is multiplied by a saw-shaped signal $V_C(t)$ from the generator, and the resulting signal is added to a saw-shaped signal $V_C(t)$ and as a corrected carrier wave $V_{CM}(t)$ is sent to one of the inputs of the comparator, which makes use of pulse width modulation, and to its second input the audio signal is sent.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawings.

BRIEF DESCRIPTION OF DRAWINGS

The object of this invention is shown in implementation examples on the enclosed drawings, where.

DESCRIPTION OF INVENTION AND PREFERRED EMBODIMENT

The solution of the compensation system that is presented above can be applied in any desired system that contains a discrete class D audio line, and in the description it is supplemented with an electroacoustic amplifier. A class D electroacoustic amplifier 1, i.e. a class D audio amplifier, without feedback loop, shown in FIG. 1, contains a comparator 3, to whose input an audio signal is sent, and a generator 4, a power stage 2, using pulse width modulation, a supply voltage source 8, an amplifier low-pass filter 14, and a loudspeaker device being the load of the amplifier 1. In the shown amplifier 1, an audio input signal 21 and an output audio signal 28 are not included in the feedback loop and coefficient of supply voltage fluctuation influence rejection is 0 dB. So to reduce the supply voltage influence on output audio signal, the electroacoustic amplifier 1 has been supplemented with a compensation system containing a low-pass filter 9 and a high-pass filter 10, both of which are connected to a power supply voltage source 8.

Figure 1:
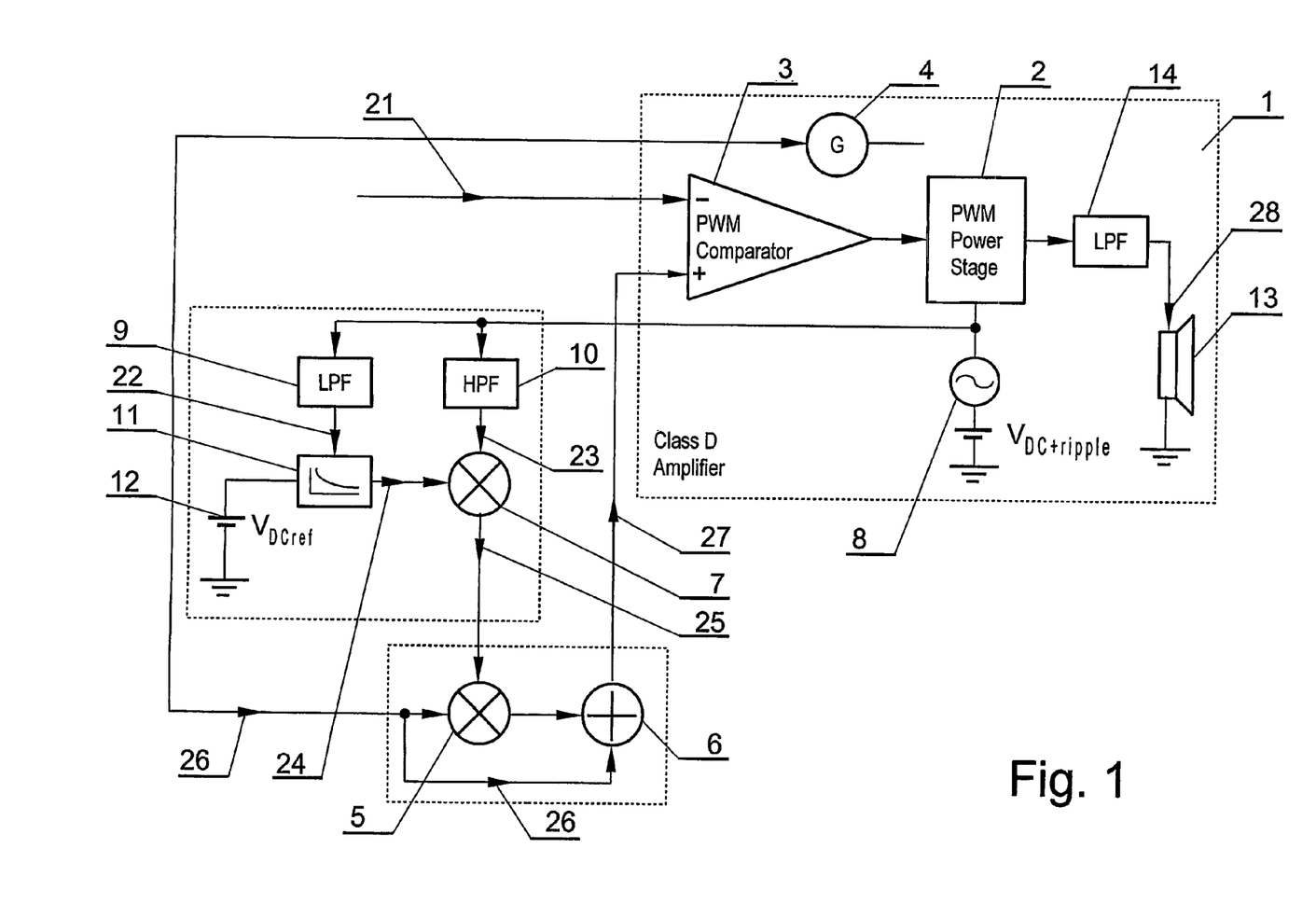
FIG. 1 shows a block diagram of a class D electroacoustic amplifier with a system for compensation of influence of supply voltage fluctuations.

The reference voltage source 12 of the compensation system is connected to an inverting circuit 11, whose input is connected to the low-pass filter 9 output. The high-pass filter 10 output and the inverting circuit 11 output are connected to a multiplier 7, whose output is connected to a multiplier 5 input, whose second input is connected to a saw-shaped or triangular-shaped voltage generator 4, while the multiplier output is connected to one of the adder 6 inputs, whose second input is connected to a saw-shaped or triangular-shaped voltage generator 4.

In the presented electroacoustic amplifier 1, with the compensation circuit of supply voltage influence on an audio output signal, the input signal 21 is sent to the '-' input of the comparator 3, where the comparison of the audio signal 21 with the carrier signal 26 $V_C(t)$, which is a carrier wave of high frequency in the range of 40 kHz to 1 MHz, takes place.

In this system, the voltage from the power supply source 8 is sent to the low-pass filter 9 and the high-pass filter 10. From the high-pass filter 10 output, a fast-changing signal 23 $v_{ii}(t)$, which is the separated variable component of the supply voltage, is sent to one of the multiplier 7 inputs, while the slow-changing signal $v_i(t)$, which is the separated constant component of the supply voltage, from the low-pass filter 9 is sent to the inverting circuit 11 input. Moreover, the voltage $V_{DCref}$ of the reference voltage source 12 is connected to the inverting circuit 11. Then, the signal 24, given by the formula $v_0(t)=k_1 \times V_{DCref}/[k_2 \times v_i(t)]$, from the inverting circuit 11 output is sent to the multiplier 7 input, where the multiplying of this signal with the fast-changing signal 23 from the high-pass filter 10 output takes place, and the received error signal, expressed by the formula $e(t)=k_3 \times v_0(t) \times v_{ii}(t)$, from the multiplier 7 input is sent to one of the multiplier 5 inputs. In the multiplier 5, the multiplying of the carrier signal 26 $V_C(t)$ from a saw-shaped or triangular-shaped voltage generator and the modified constant component 25 $e(t)$ from multiplier 7, is performed. Then, the signal from the multiplier 5 is added in the adder 6 to the carrier signal 26. The received signal 27, which is the corrected high-frequency carrier wave, expressed by the formula $V_{CM}(t)=k_4 \times V_C(t) \times [1/k_5+e(t)]$, from the adder 6 output is sent to the '+' input of the comparator. With the use of the multiplier 5, the adder 6, the multiplier 7, the filter 9, the filter 10, the inverting circuit 11 and the reference voltage source 12, a corrected carrier wave $V_{CM}(t)$ is generated, by which it is possible to maintain a constant envelope of the audio output signal sent to the loudspeaker device 13. The coefficients in the formulas take the values from the ranges $k_1 \in <0.5; 2.0>$, $k_2 \in <0.2; 1.5>$, $k_3 \in <0.8; 10.0>$, $k_4 \in <0.2; 1.5>$, $k_5 \in <0.2; 3.0>$ and $k_6 \in <0.2; 3.0>$.

The presented system solves the problem of a low coefficient of rejection of influence of supply voltage fluctuations, called the Power Supply Rejection Ratio coefficient (PSRR), when the amplifier has no feedback loop. In this system, in order to increase the Power Supply Rejection Ratio coefficient, signals distorting the source voltage 8 signal are generated without the use of the audio signal. Thus, the audio signal is not modified directly, but indirectly through a modification of a carrier signal. In the presented system, the compensation of the constant component fluctuations takes place through the multiplier 5, the adder 6, the low-pass filter 9, the inverting circuit 11, and the compensation of the variable component fluctuations takes place through the multiplier 5, the adder 6, the high-pass filter 10, the inverting circuit 11 and the reference voltage source 12.

Figure 2:
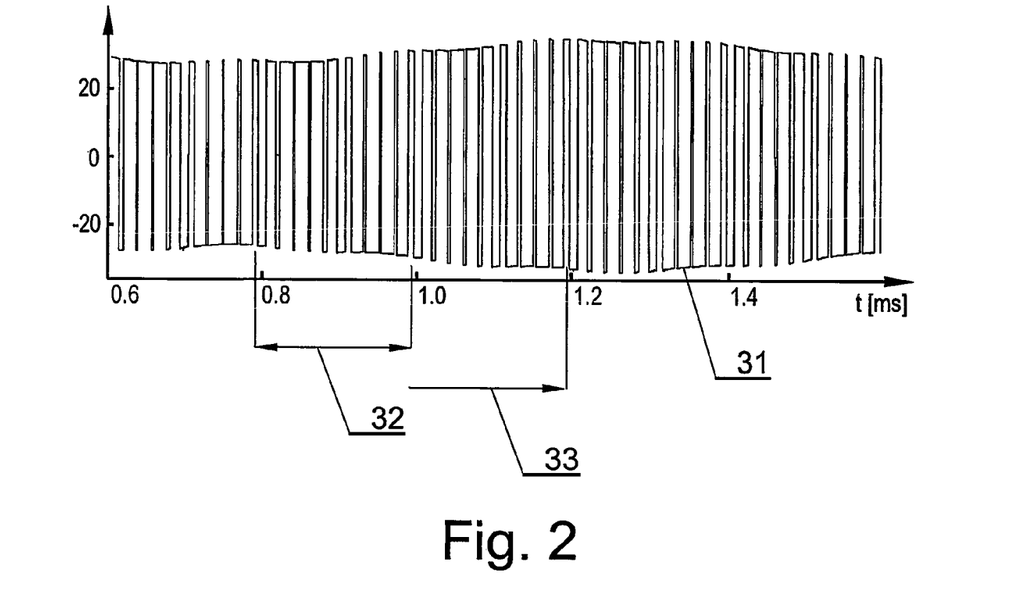
FIGS. 2 and 3 show the result of computer simulation with the compensation system present and the supply voltage of 27 V.
Figure 3:
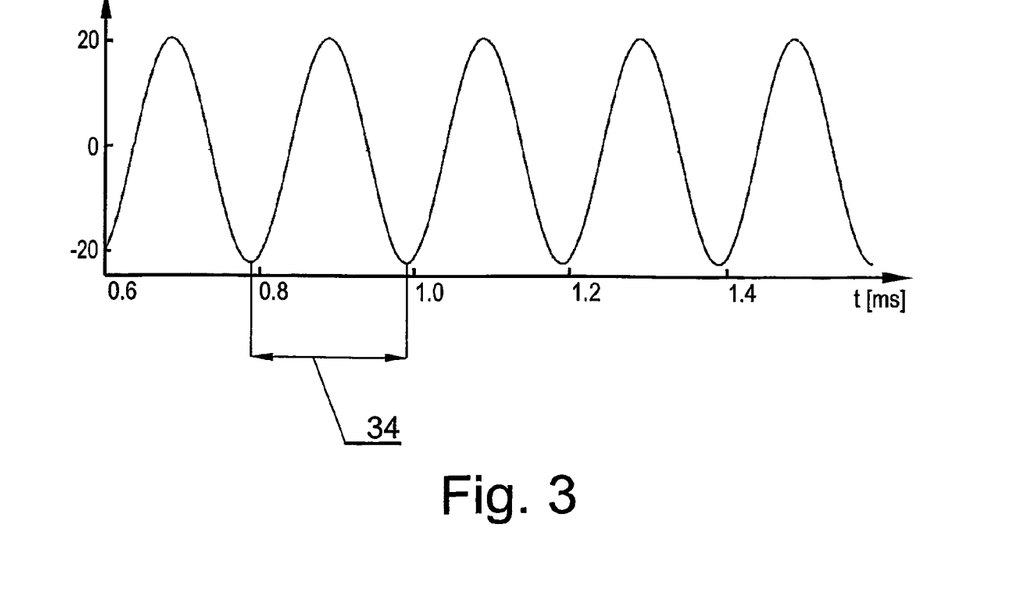

Further figures show the results of a computer simulation of the amplifier. FIG. 2 shows a signal 31 at the output of the power stage with the power supply influence compensation system present. The signal 31 is amplitude-modulated with a variable component of a 3 V amplitude and a frequency 33 of 1 kHz, while the frequency 32 of the audio signal is 5 kHz and the supply voltage is 27 V. FIG. 3 shows a sinusoidal signal with a frequency 34 of 5 kHz at the output with a load of 8 Ω.

Figure 4:
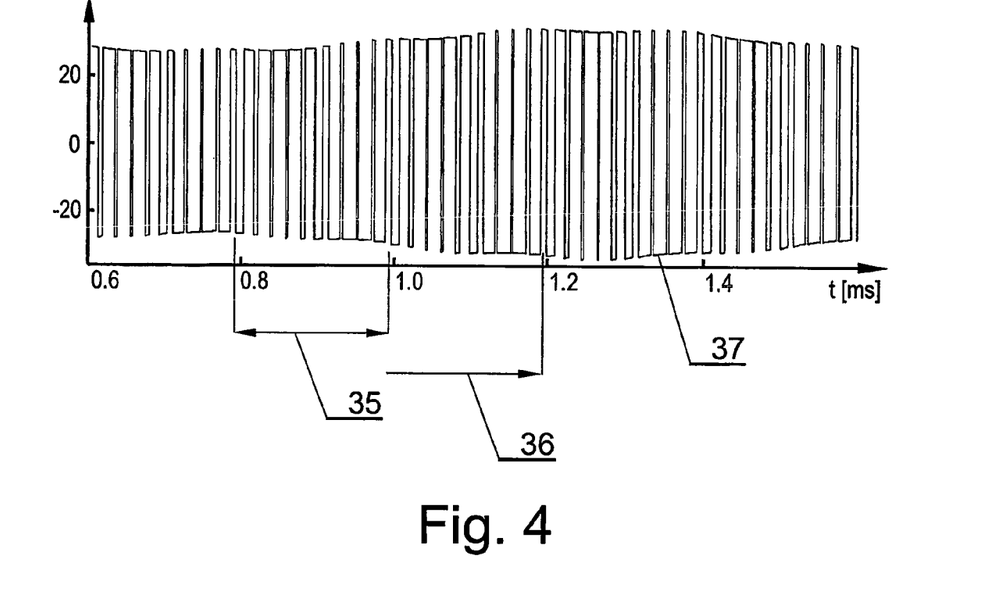
FIGS. 4 and 5 show the result of computer simulation without the compensation system present and with the supply voltage of 27 V.
Figure 5:
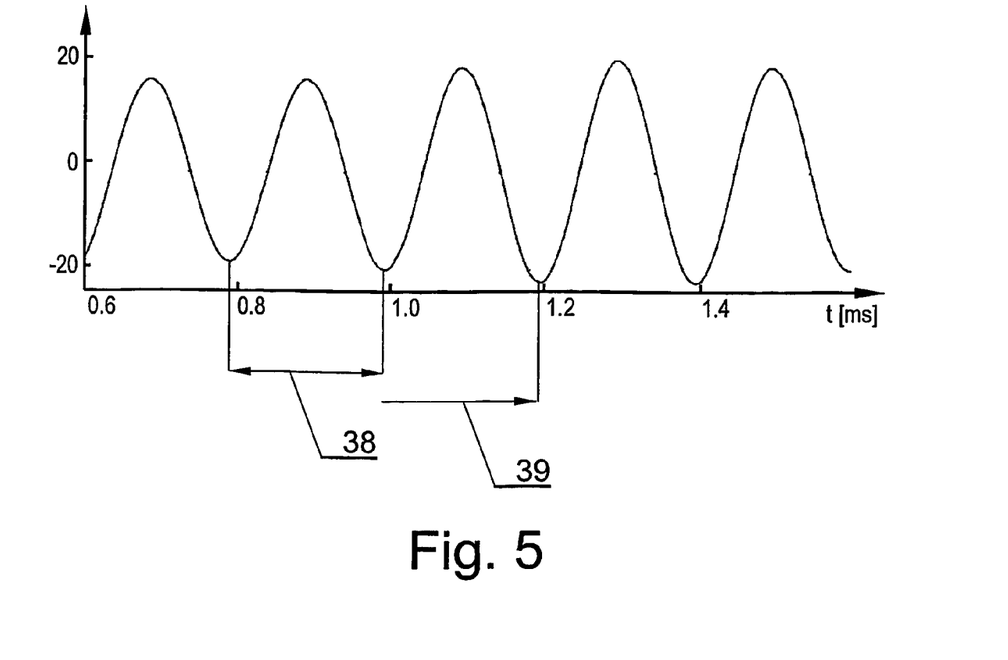

In turn, FIG. 4 shows a signal 37 at the output of the power stage without the power supply influence compensation system present. This signal is also amplitude-modulated by a variable component of a 3 V amplitude and a frequency 36 of 1 kHz, while the frequency 35 of the audio signal is 5 kHz. FIG. 5 shows a sinusoidal signal with a frequency 38 of 5 kHz at the output with a load of 8 Ω. The envelope of the output wave is visibly modulated and the frequency 39 of amplitude fluctuations is 1 kHz.

Figure 6:
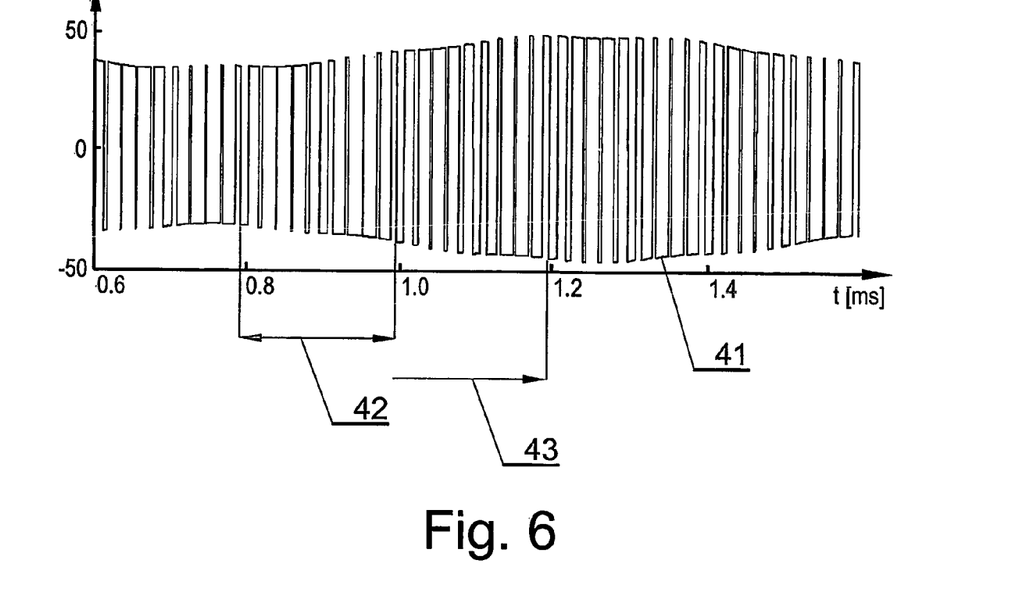
FIGS. 6 and 7 show the result of computer simulation with the compensation system present and with the supply voltage of 40 V.
Figure 7:
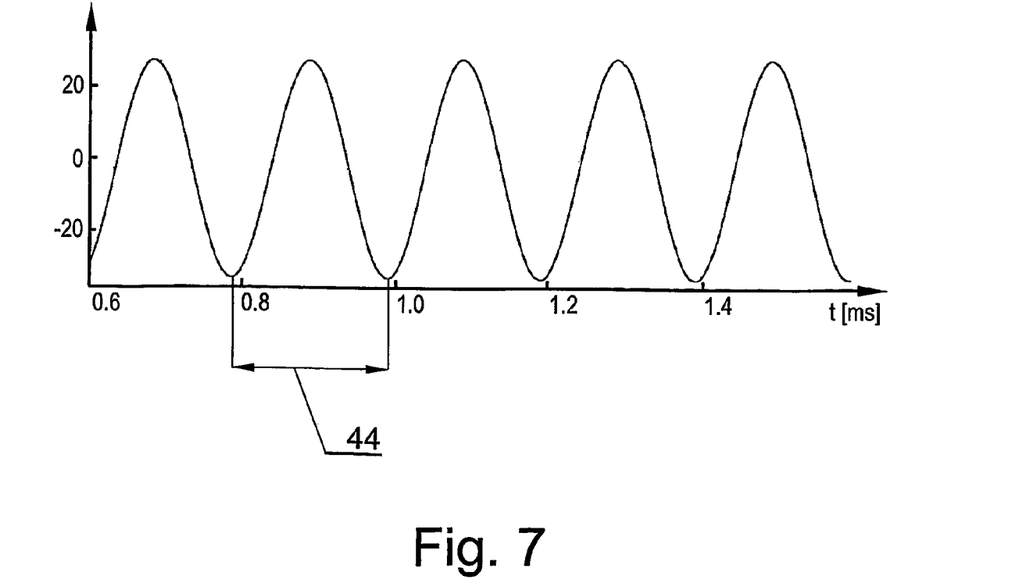

FIG. 6 shows a signal 41 at the output of the power stage with the power supply influence compensation system present and with values of voltages changed in comparison with signal 31 in FIG. 2. The signal 41 is also amplitude-modulated by a variable component of a 7 V amplitude and a frequency 43 of 1 kHz, while the frequency 42 of the audio signal is 5 kHz and the power supply voltage is 40 V. FIG. 7 shows a sinusoidal signal with a frequency 44 of 5 kHz at the output with a load of 8 Ω, as well.

Figure 8:
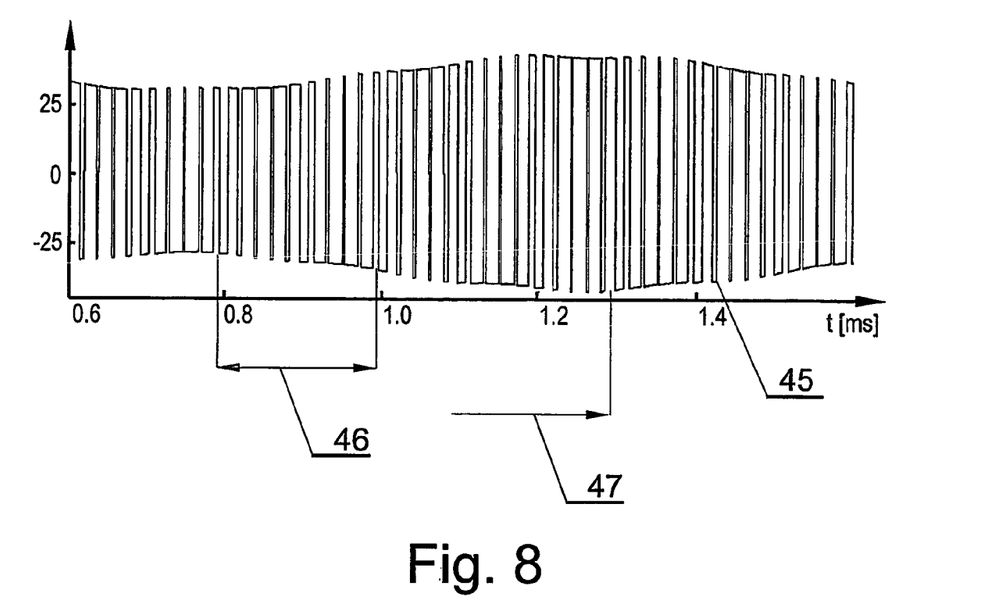
FIGS. 8 and 9 show the result of computer simulation without the compensation system present and with the supply voltage of 40 V.
Figure 9:
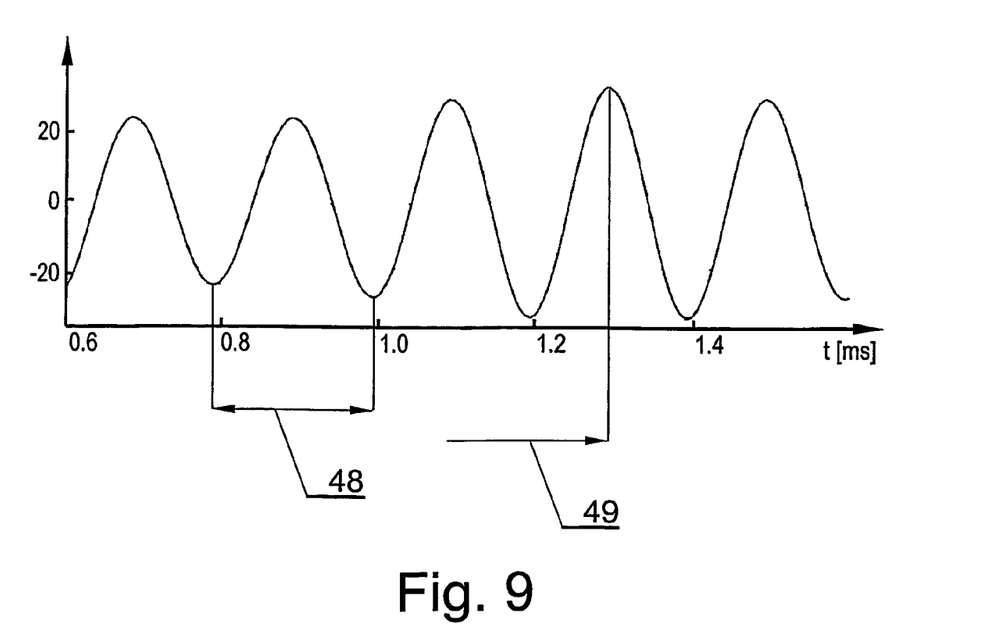

FIG. 8 shows a signal 45 at the output of the power stage without the power supply influence compensation system present. The signal, similarly to the one shown above (FIG. 5), is amplitude-modulated by a variable component of a 7 V amplitude and a frequency 46 of 1 kHz, while the frequency 45 of the audio signal is 5 kHz. FIG. 9 shows a sinusoidal signal with a frequency 48 of 5 kHz at the output with a load of 8 Ω. The envelope of the output wave is visibly modulated and the frequency 49 of amplitude fluctuations is 1 kHz.

The compensation system of power supply influence on output audio signal for the class D electroacoustic amplifier, presented above, solves to a significant degree problems of stability of the amplifier, including problems of setting a phase margin.

It will be understood that each of the elements described above, or two or more together, may also find a useful application in other types of amplifiers differing from the types described above.

While the invention has been illustrated and described as embodied in the context of a class D audio amplifier, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

The invention claimed is:

1. A class D audio amplifier without feedback loop containing a supply voltage source (8), an amplifier low-pass filter (14), a power stage (2) controlled by a pulse width modulated signal, a saw-shaped voltage generator (4) and a comparator (3), to one of which inputs an audio signal is sent, while its second input is connected to the adder (6) of the compensation circuit of supply voltage influence on the output audio signal, to which a voltage from a reference voltage source is sent, characterized in that a low-pass filter (9) and a high-pass filter (10) are connected to the supply voltage source (8), and the reference voltage source (12) is connected to an inverting circuit (11), whose input is connected to the low-pass filter (2) output, while the high-pass filter (10) output and the output of the inverting circuit (11) are connected to a multiplier (7), whose output is connected to the input of another multiplier (5), whose second input is connected to the saw-shaped voltage generator (4), and the multiplier (5) output is connected to one input of the adder (6), whose second input is connected to the saw-shaped voltage generator (4).

2. The class D audio amplifier, according to claim 1, characterized in that the output signal $v_0(t)$ of the inverting circuit (11) sent to the multiplier (7) input, which is a modified constant of the supply voltage, is expressed by a formula $v_0(t)=k_1 \times V_{DCref}/[k_2 \times v_i(t)]$, where $V_{DCref}$ is the voltage of the reference source, $v_i(t)$ is a slow-changing signal on the low-pass filter (9) output, and the coefficient $k_1 \in <0.5; 2.0>$ and the coefficient $k_2 \in <0.2; 1.5>$.

3. The class D audio amplifier, according to claim 2, characterized in that the output signal of the multiplier (7), which is the error signal e(t), sent to the multiplier (5), is expressed by the formula $e(t)=k_3 \times v_0(t) \times v_{ii}(t)$, where $v_0(t)$ is a modified supply voltage constant, $v_{ii}(t)$ is a fast-changing signal on the high-pass filter (10) output, and the coefficient $k_3 \in <0.8; 10.0>$.

4. The class D audio amplifier, according to claim 3, characterized in that the output signal $V_{CM}(t)$ of the adder (6), which is the corrected carrier wave signal, sent to one input of the comparator (3), is expressed by the formula $V_{CM}(t)=k_4 \times V_C(t) \times [1/k_5+e(t)]$, where $V_C(t)$ is a high frequency carrier wave generated by the generator (4), e(t) is the error signal, and the coefficient $k_4 \in <0.2; 1.5>$ and the coefficient $k_5 \in <0.2; 3.0>$.

5. A method of compensation of supply voltage influence on the output audio signal in an audio amplifier, which contains a saw-shaped signal generator and a comparator making use of pulse width modulation, and which is powered from a power supply, and to whose input an audio signal is sent, and whose second input is connected to an adder of a compensation circuit of supply voltage influence on the output audio signal, to which a voltage from a reference voltage source is sent, characterized in that from the power supply source (8) a fast-changing signal $v_{ii}(t)$ and a slow-changing signal $v_i(t)$ are extracted and then the slow-changing signal $v_i(t)$ is inverted and multiplied by the a value of a reference supply voltage $V_{DCref}$ which results in an output signal $v_0(t)$, which then is multiplied by a fast-changing signal $v_{ii}(t)$, which results in an error signal e(t), which then is multiplied by a saw-shaped signal $V_C(t)$ from the generator (4), and the resulting signal is added to a saw-shaped signal $V_C(t)$ and as a corrected carrier wave $V_{CM}(t)$ is sent to one of the inputs of the comparator (3), which makes use of pulse width modulation, and to its second input the audio signal is sent.

6. The method of compensation of supply voltage influence, according to claim 5, characterized in that the output signal $v_0(t)$ of the inverting circuit (11) sent to the multiplier (7) input, which is a modified constant of the supply voltage, is expressed by a formula $v_0(t)=k_1 \times V_{DCref}/[k_2 \times v_i(t)]$, where $V_{DCref}$ is the voltage of the reference source, $v_i(t)$ is a slow-changing signal on the low-pass filter (9) output, and the coefficient $k_1$ takes the values from the range $<0.5; 2.0>$ and the coefficient $k_2$ takes the values from the range $<0.2; 1.5>$.

7. The method of compensation of supply voltage influence, according to claim 6, characterized in that the output signal of the multiplier (7), which is the error signal e(t), sent to the multiplier (5), is expressed by the formula $e(t)=k_3 \times v_0(t) \times v_{ii}(t)$, where $v_0(t)$ is a modified supply voltage constant, $v_{ii}(t)$ is a fast-changing signal on the high-pass filter (10) output, and the coefficient $k_3$ takes the values from the range $<0.8; 10.0>$.

8. The method of compensation of supply voltage influence, according to claim 7, characterized in that the output signal $V_{CM}(t)$ of the adder (6), which is the corrected carrier wave signal, sent to one input of the comparator (3), is expressed by the formula $V_{CM}(t)=k_4 \times V_C(t) \times [1/k_5+e(t)]$, where $V_C(t)$ is a high frequency carrier wave generated by the generator (4), e(t) is the error signal, and the coefficient $k_4$ takes the values from the range $<0.2; 1.5>$ and the coefficient $k_5$ takes the values from the range $<0.2; 3.0>$.

9. A class D audio amplifier comprising
a comparator having a first input coupled to an audio signal and a second input;
a supply voltage source;
a power stage coupled to the supply voltage source and to an amplifier loaded by a loudspeaker, the power stage controlled by a pulse-width modulated signal received from the comparator;
a saw-shaped voltage generator for generating a carrier signal of high frequency; and
a compensation circuit for providing a modified carrier signal to the second input of the comparator,
whereby the modified carrier signal is generated by the compensation circuit as a function of the carrier signal and the supply voltage source signal, which are sent to inputs of the compensation circuit.

10. The class D audio amplifier according to claim 9, characterized in that the compensation circuit comprises
a low-pass filter coupled to the supply voltage source and generating a slow-changing signal at a low-pass filter output;

a high-pass filter coupled to the supply voltage source and generating a fast-changing signal at a high-pass filter output;
a reference voltage source;
an inverting circuit coupled to the reference voltage source and to the low-pass filter output and generating an inverting circuit signal at an inverting circuit output;
a first multiplier coupled to the high-pass filter output and the inverting circuit output and generating an error signal at an output of the first multiplier;
a second multiplier coupled to the saw-shaped voltage generator and the output of the first multiplier and generating a signal of the second multiplier at an output of the second multiplier; and
an adder connected to the saw-shaped voltage generator and the output of the second multiplier and generating a corrected carrier wave sent to the second input of the comparator.

* * * * *